(12) United States Patent  
Uzu et al.

(10) Patent No.: US 10,529,882 B2  
(45) Date of Patent: Jan. 7, 2020

(54) METHOD FOR MANUFACTURING MULTIJUNCTION PHOTOELECTRIC CONVERSION DEVICE

(71) Applicant: KANEKA CORPORATION, Osaka (JP)

(72) Inventors: Hisashi Uzu, Osaka (JP); Mitsuru Ichikawa, Osaka (JP); Toru Terashita, Osaka (JP); Kenji Yamamoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/152,608

(22) Filed: Oct. 5, 2018

(65) Prior Publication Data

US 2019/0044016 A1  Feb. 7, 2019

Related U.S. Application Data

(63) Continuation of application No. PCT/JP2017/005990, filed on Feb. 17, 2017.

(30) Foreign Application Priority Data

Apr. 7, 2016  (JP) .................. 2016-077248

(51) Int. Cl.  
*H01L 21/00* (2006.01)  
*H01L 31/0725* (2012.01)  
(Continued)

(52) U.S. Cl.  
CPC ...... *H01L 31/0725* (2013.01); *H01L 31/0224* (2013.01); *H01L 31/022466* (2013.01);  
(Continued)

(58) Field of Classification Search  
CPC ......... H01L 31/0725; H01L 31/022466; H01L 31/03685; H01L 31/078; H01L 31/0224; Y02E 10/50  
(Continued)

(56) References Cited

U.S. PATENT DOCUMENTS 4,496,788 A     1/1985  Hamakawa et al.  
6,653,550 B2 *  11/2003  Hayashi ............... H01L 31/076  
                                                     136/244  
(Continued)

FOREIGN PATENT DOCUMENTS

JP     S59-124772 A     7/1984  
JP     2001-168355 A    6/2001  
(Continued)

OTHER PUBLICATIONS

International Search Report issued in International Application No. PCT/JP2017/005990, dated Apr. 4, 2017 (2 pages).  
(Continued)

*Primary Examiner* — Vu A Vu  
(74) *Attorney, Agent, or Firm* — Osha Liang LLP (57) ABSTRACT

A method for manufacturing a multi-junction photoelectric conversion device includes forming a first electrode on a first photoelectric conversion unit including a first semiconductor layer as a photoelectric conversion layer, the first electrode including a plurality of patterned regions separated from one another by separation grooves; and eliminating a leakage existing in the first semiconductor layer by applying a reverse bias voltage between one of the patterned regions of the first electrode and a second photoelectric conversion unit comprising a second semiconductor layer as a photoelectric conversion layer. The application of the reverse bias voltage is performed while irradiating the second photoelectric conversion unit with light, generating a photocurrent in the second photoelectric conversion unit that is larger than a photocurrent in the first photoelectric conversion unit.

15 Claims, 7 Drawing Sheets

(51) Int. Cl.
  *H01L 31/0224* (2006.01)
  *H01L 31/078* (2012.01)
  *H01L 31/0368* (2006.01)

(52) U.S. Cl.
  CPC ...... *H01L 31/03685* (2013.01); *H01L 31/078* (2013.01); *Y02E 10/50* (2013.01)

(58) Field of Classification Search
  USPC .......................................................... 438/74
  See application file for complete search history.

(56) References Cited

U.S. PATENT DOCUMENTS

| | | | |
|---|---|---|---|
| 2011/0126891 A1* | 6/2011 | Goto ...................... | B82Y 20/00 |
| | | | 136/255 |
| 2011/0192452 A1* | 8/2011 | Yamazaki ............. | H01L 31/028 |
| | | | 136/255 |
| 2015/0249170 A1 | 9/2015 | Snaith et al. | |
| 2016/0071655 A1* | 3/2016 | Li ........................ | H01G 9/2022 |
| | | | 136/254 |

FOREIGN PATENT DOCUMENTS

| | | |
|---|---|---|
| JP | 2003-258281 A | 9/2003 |
| JP | 2015-535390 A | 12/2015 |
| WO | 2014/045021 A1 | 3/2014 |

OTHER PUBLICATIONS

International Preliminary Report on Patentability issued in International Application No. PCT/JP2017/005990; dated Oct. 18, 2018 (6 pages).

* cited by examiner

METHOD FOR MANUFACTURING MULTIJUNCTION PHOTOELECTRIC CONVERSION DEVICE

TECHNICAL FIELD

One or more embodiments of the present invention relate to a method for manufacturing a multi-junction photoelectric conversion device in which a plurality of photoelectric conversion units having different band gaps are stacked.

BACKGROUND

A multi-junction photoelectric conversion device (multi-junction solar cell) in which a plurality of photoelectric conversion units are stacked in series is known. For example, Patent Document 1 discloses a multi-junction thin-film photoelectric conversion device in which an amorphous photoelectric conversion unit (top cell) including an amorphous silicon thin-film as a photoelectric conversion layer, and a photoelectric conversion unit (bottom cell) including a microcrystalline silicon thin-film as a photoelectric conversion layer are stacked. Patent Document 2 discloses a multi-junction photoelectric conversion device in which as a top cell, an amorphous silicon photoelectric conversion unit is stacked on the light-receiving side of a bottom cell including a crystalline silicon substrate. Patent Document 3 discloses a multi-junction photoelectric conversion device in which as a top cell, a perovskite photoelectric conversion unit is stacked on the light-receiving side of a bottom cell including a crystalline silicon substrate etc.

In a semiconductor thin-film that is used as a photoelectric conversion layer, generation of defects such as pinholes during deposition by chemical vapor deposition (CVD), sputtering, vacuum vapor deposition, solution coating, or the like is unavoidable, and these defects cause leakage between electrodes. A method is known in which for the purpose of eliminating leakage caused by pinholes or the like of a thin-film, a reverse bias voltage is applied between electrodes of a photoelectric conversion device to eliminate a leakage path. By application of a reverse bias voltage, current is concentrated on a leakage portion of a semiconductor thin-film, and therefore local generation of heat occurs, so that the leakage portion is insulated by oxidation or melting.

Defects such as pinholes during formation of a thin-film generate in random. For eliminating leakage by applying a reverse bias voltage to a semiconductor thin-film having a large area, passage of a current to a plurality of randomly generated leakage portions is necessary so that it is required to increase a reverse bias voltage to be applied. However, when the reverse bias voltage is increased, there arises the problem that a large current passes to a leakage portion existing in the vicinity of a contact point between a probe and an electrode for applying a voltage, so that pinholes are expanded due to generation of a large amount of heat, or a voltage exceeding a withstand voltage is applied to a normal portion, leading to breakage of an element.

Thus, when a reverse bias voltage is applied to a thin-film photoelectric conversion device to eliminate leakage, a semiconductor thin-film is divided into small-area regions, and the reverse bias voltage is applied to each of the small-area regions. For example, in Patent Document 1, a stacked cell of an amorphous silicon photoelectric conversion unit (top cell) and a microcrystalline silicon photoelectric conversion unit (bottom cell) is divided into a plurality of small-area cells, and a reverse bias voltage is applied to a multi-junction photoelectric conversion device obtained by integrating the plurality of cells into a serial array so that leakage is removed.

In a multi-junction photoelectric conversion device in which a plurality of photoelectric conversion units are stacked, generally leakage portions of the top cell and the bottom cell do not coincide with each other, and thus elimination of leakage by application of a reverse bias voltage tends to be difficult. For example, even when a reverse bias voltage is applied for eliminating leakage existing in the top cell of the multi-junction photoelectric conversion device, the bottom cell behaves as a resistor, and therefore in application of such a reverse bias voltage within a range where an element is not broken, passage of an amount of current sufficient to insulate leakage portions is difficult.

Patent Document 1 suggests a method in which leakage in a plurality of cells is sequentially eliminated by selectively feeding a reverse bias current into a cell to be subjected to elimination of leakage in a state in which cells other than the cell to be subjected to elimination of leakage are irradiated with light to generate a photocurrent. For example, when leakage in an amorphous silicon thin-film of a top cell in a specific small-area region is eliminated, the target small-area region is irradiated with long-wavelength light that can be absorbed by microcrystalline silicon of a bottom cell while other small-area regions are irradiated with light in a wide wavelength range, so that a photocurrent is generated in cells other than the top cell in the target small-area region. When a reverse bias voltage is applied in this state, a reverse bias current selectively passes into a leakage portion of the target small-area region, so that leakage can be eliminated. When a reverse bias voltage is then applied with a photocurrent generated in cells other than the bottom cell by irradiating the target small-area region with short-wavelength light that can be absorbed by amorphous silicon, leakage in the top cell can be eliminated.

PATENT DOCUMENTS

Patent Document 1: JP 2001-168355 A
Patent Document 2: JP S59-124772 A
Patent Document 3: WO 2014/045021

In a multi-junction thin-film photoelectric conversion device in which a plurality of photoelectric conversion units each having a semiconductor thin-film as a photoelectric conversion layer are stacked as in Patent Document 1, leakage can be eliminated without passage of an excessively large current when all photoelectric conversion units are divided into small-area regions, and each of the regions is subjected to reverse bias processing. On the other hand, a method is not known in which leakage is eliminated by applying a reverse bias voltage to a multi-junction photoelectric conversion device in which a photoelectric conversion unit having a semiconductor substrate as a photoelectric conversion layer and a photoelectric conversion unit having a semiconductor thin-film as a photoelectric conversion layer are stacked as in Patent Document 2 and Patent Document 3.

In a photoelectric conversion device including a semiconductor substrate, division of a semiconductor substrate into small-area parts results in complication of integration in modularization, and deterioration of conversion efficiency due to a decrease in light-receiving area. In view of the above, one or more embodiments of the present invention provide a method for manufacturing a multi-junction photoelectric conversion device excellent in conversion characteristics by eliminating leakage existing in a thin-film photoelectric conversion layer without decreasing a light-receiving area.

SUMMARY

In one or more embodiments, a multi-junction photoelectric conversion device includes a first electrode, a first photoelectric conversion unit, and a second photoelectric conversion unit that is connected to the first photoelectric conversion unit in series, arranged in this order. The first photoelectric conversion unit includes a first semiconductor layer as a photoelectric conversion layer, and the second photoelectric conversion unit includes a second semiconductor layer as a photoelectric conversion layer. The first semiconductor layer and the second semiconductor layer as photoelectric conversion layers have different band gaps, and of the first photoelectric conversion unit and the second photoelectric conversion unit, one including a photoelectric conversion layer having a wider band gap is disposed on the light-receiving side.

In one or more embodiments, when the first semiconductor layer has a band gap wider than that of the second semiconductor layer, the light-receiving surface is on the first photoelectric conversion unit side. In this case, the first electrode, which is a light-receiving surface electrode provided on the first photoelectric conversion unit, is a transparent electrode. When the light-receiving surface is on the second photoelectric conversion unit side, the first electrode may be either a transparent electrode or a metal electrode.

In one or more embodiments, the first semiconductor layer is a thin-film such as a silicon-based thin-film, a compound semiconductor thin-film, an organic semiconductor thin-film, or an organic-inorganic hybrid semiconductor thin-film containing a photosensitive material having a perovskite-type crystal structure. The second semiconductor layer may be either a thin-film or a crystalline semiconductor substrate. In one embodiment, the second semiconductor layer is a crystalline silicon substrate, and the first semiconductor layer is a thin-film containing a photosensitive material having a perovskite-type crystal structure.

In the manufacturing method according to one or more embodiments of the present invention, a first electrode patterned in a plurality of regions separated by a separation groove is disposed on the first photoelectric conversion unit. Examples of the method for forming a first electrode separated into a plurality of regions include a method in which an electrode layer is deposited, and then irradiated with laser light to form a separation groove; a method in which an electrode layer is deposited, and a separation groove is then formed by pattern etching; and a method in which an electrode having a separation groove in a mask-covered region is deposited by mask deposition.

In one or more embodiments, a reverse bias voltage is applied between one of a plurality of regions of the first electrode and the second photoelectric conversion unit. By applying a reverse bias voltage while preferentially irradiating the second photoelectric conversion unit with light so as to generate a larger photocurrent in the second photoelectric conversion unit than in the first photoelectric conversion unit, a leakage path existing in the first semiconductor layer is eliminated.

In one or more embodiments, the reverse bias voltage is applied with a power supply electrically connected to the first electrode. In one embodiment, a metal electrode is disposed in each of a plurality of regions of the first electrode, and a reverse bias voltage is applied with the metal electrode electrically connected to the power supply.

In one or more embodiments, after elimination of leakage in the first semiconductor layer by application of the reverse bias voltage, a plurality of mutually separated regions of the first electrode may be electrically connected. Electrical connection of a plurality of regions of the first electrode is performed by filling the separation groove with an electroconductive material, or disposing an electroconductive material on the first electrode so as to extend over a plurality of regions of the first electrode. Examples of the electroconductive material for electrically connecting a plurality of regions of the first electrode include transparent electroconductive materials such as metal oxides, and metallic materials.

Preferably, the separation groove is filled with the electroconductive material over substantially the entire length of the separation groove. For example, by forming a transparent electroconductive layer over the entire surface of a first electrode-formed region and a separation groove-formed region, the separation groove is filled with a transparent electroconductive material to electrically connect a plurality of regions of the first electrode. In addition, a finger electrode may be formed by filling the separation groove with a metallic material.

In one or more embodiments, the reverse bias voltage may be applied with the second photoelectric conversion unit preferentially irradiated with light after a plurality of regions of the first electrode are electrically connected. By this second reverse bias processing, leakage in the first semiconductor layer under the separation groove-formed region can be eliminated.

In one or more embodiments, a plurality of regions of the first electrode may be electrically connected by providing an electroconductive material so as to extend over a plurality of regions of the first electrode. A plurality of regions of the first electrode may be electrically connected by, for example, disposing a bus bar electrode, a wiring member, or the like so as to extend in a direction perpendicular to the extending direction of the separation groove. Before the electroconductive material is disposed so as to extend over a plurality of regions of the first electrode, the separation groove may be filled with an insulating material for the purpose of preventing leakage or the like that is caused by ingress of the electroconductive material into the separation groove.

With the manufacturing method according to one or more embodiments of the present invention, leakage in the thin-film photoelectric conversion layer at a portion corresponding to a small-area region of an electrode patterned by the reverse bias processing is eliminated. In reverse bias processing for eliminating leakage, a reverse bias voltage is applied to small-area regions of an electrode divided into a plurality of regions, and therefore a total current for elimination of leakage removal is not excessively large. In addition, since it is not necessary that a photoelectric conversion unit including a semiconductor substrate and a semiconductor thin-film be divided into small-area parts, a complicated integration step can be avoided, and leakage can be eliminated without decreasing the light-receiving area of a photoelectric conversion layer, so that a multi-junction photoelectric conversion device excellent in conversion characteristics can be obtained. In particular, one or more embodiments of the present invention are useful for improving the conversion characteristics of a multi-junction photoelectric conversion device in which a photoelectric conversion unit having as a photoelectric conversion layer a semiconductor substrate such as a crystalline silicon substrate and a photoelectric conversion unit having a thin-film as a photoelectric conversion layer are stacked.

DETAILED DESCRIPTION OF THE EMBODIMENTS

Figure 1:
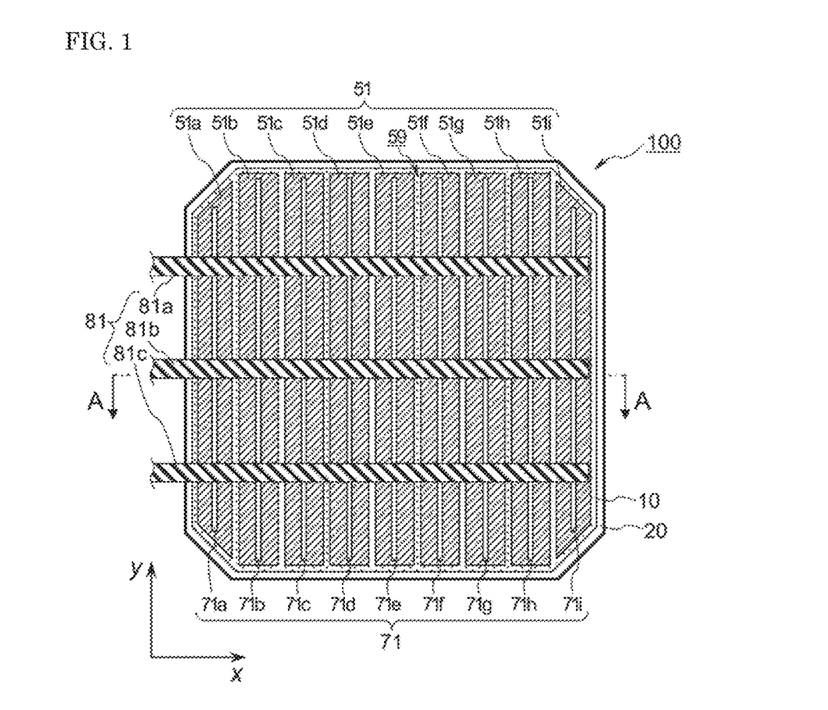
FIG. 1 is a plan view of a multi-junction photoelectric conversion device according to one or more embodiments of the present invention.
Figure 2:
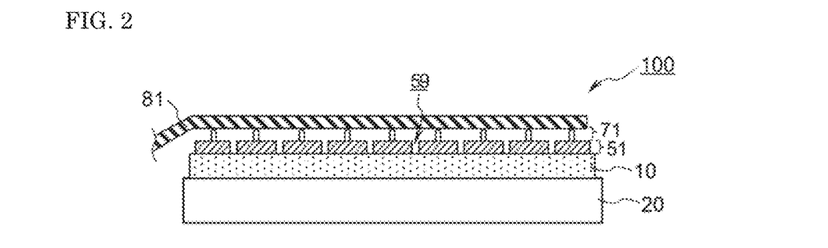
FIG. 2 is a sectional view taken along line A-A in FIG. 1.

FIG. 1 is a plan view of a multi-junction photoelectric conversion device 100 according to one or more embodiments of the present invention, and FIG. 2 is a sectional view taken along line A-A in FIG. 1. The photoelectric conversion device according to the present invention is a multi-junction photoelectric conversion device in which a first photoelectric conversion unit 10 and a second photoelectric conversion unit 20 are stacked and connected in series.

The multi-junction photoelectric conversion device 100 has a first electrode 51 on the first photoelectric conversion unit 10. The first electrode 51 is patterned in stripe, separated by a separation groove 59 extending in a second direction (y direction), and divided into belt-like small-area regions 51a to 51i arranged in a first direction (x direction). Finger electrodes 71a to 71i extending in the second direction are disposed on the belt-like regions 51a to 51i, respectively. The finger electrodes 71a to 71i are electrically connected through an electroconductive wiring member (interconnector) 81 disposed on the finger electrodes. The interconnector 81 provided in the multi-junction photoelectric conversion device 100 is electrically connected to an adjacent photoelectric conversion device to modularize the photoelectric conversion devices.

[Configuration of Photoelectric Conversion Unit]

Figure 3:
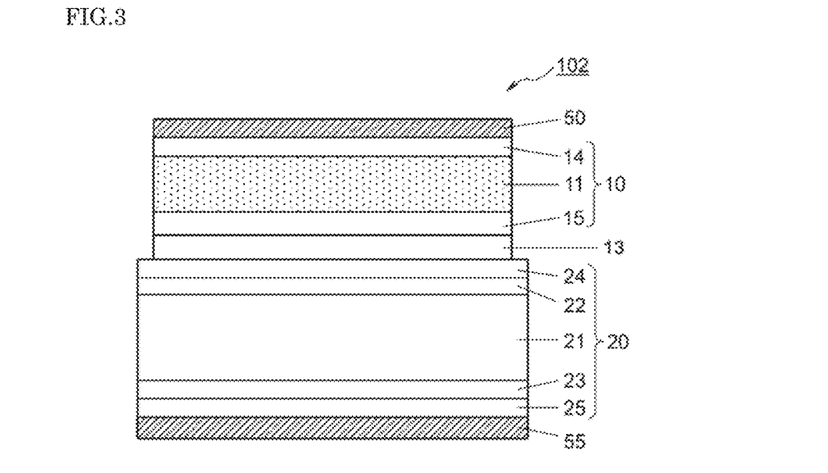
FIG. 3 is a schematic sectional view showing one example of a stacking configuration of a multi-junction photoelectric conversion unit.

FIG. 3 is a schematic sectional view showing one or more embodiments of a multi-junction unit in which the first photoelectric conversion unit 10 and the second photoelectric conversion unit 20 are stacked. A first electrode 50 is disposed on a surface on the first photoelectric conversion unit 10 side, and a second electrode 55 is disposed on a surface on the second photoelectric conversion unit 20 side.

The first photoelectric conversion unit 10 includes a first semiconductor layer which is a thin film as a photoelectric conversion layer 11. The first semiconductor layer absorbs light to generate photocarriers. Examples of the thin-film that forms the first semiconductor layer 11 include silicon-based semiconductor thin-films of amorphous silicon, microcrystalline silicon, and the like; compound semiconductor thin-films of CIS, CIGS, and the like; organic semiconductor thin-films; and organic-inorganic hybrid semiconductor thin-films.

As the organic-inorganic hybrid semiconductor, a perovskite thin-film containing a photosensitive material having a perovskite-type crystal structure may be used in one or more embodiments. The compound that forms the perovskite-type crystal material is represented by, for example, a general formula of $R^1NH_3M^1X_3$ or $HC(NH_2)_2M^1X_3$. In the formula, $R^1$ is an alkyl group, preferably an alkyl group having 1 to 5 carbon atoms, especially preferably a methyl group. $M^1$ is a divalent metal ion, preferably Pb or Sn. X is a halogen, and examples thereof include F, Cl, Br and I. All three Xs may be the same halogen element, or include a plurality of halogens.

A compound represented by a formula $CH_3(NH_3)Pb(I_{1-x}Br_x)_3$, where $0 \leq x \leq 1$, is a preferable example of a compound that constitute the perovskite-type crystal material. The spectral sensitivity characteristic can be adjusted by changing the type and ratio of the halogen. A perovskite semiconductor thin-film may be formed by any kinds of dry processes or solution casting methods such as spin coating.

The photoelectric conversion unit 10, which includes a perovskite semiconductor thin-film as the photoelectric conversion layer 11, has charge transport layers 14 and 15. One of the charge transport layers 14 and 15 is a hole transport layer, and the other is an electron transport layer.

In one or more embodiments, examples of the material of the hole transport layer include polythiophene derivatives such as poly-3-hexylthiophene (P3HT) and poly(3,4-ethylenedioxythiophene) (PEDOT), fluorene derivatives such as 2,2',7,7'-tetrakis-(N,N-di-p-methoxyphenylamine)-9,9'-spirobifluorene (Spiro-OMeTAD), carbazole derivatives such as polyvinyl carbazole, triphenylamine derivatives, diphenylamine derivatives, polysilane derivatives and polyaniline derivatives. Examples of the material of the electron transport layer include metal oxides such as titanium oxide, zinc oxide, niobium oxide, zirconium oxide and aluminum oxide.

In one or more embodiments, when the first photoelectric conversion unit 10 is a silicon-based thin-film photoelectric conversion unit including a pin junction, the first semiconductor layer 11 is an intrinsic (i-type) silicon-based thin-film. Examples of the silicon-based thin-film include thin-films of amorphous silicon, an amorphous silicon alloy, microcrystalline silicon, a microcrystalline silicon alloy, and the like. Examples of the silicon alloy include silicon carbide, silicon oxide, silicon nitride, and silicon germanium. When the first photoelectric conversion unit 10 includes a pin junction, one of conductive semiconductor layers 14 and 15 is a p-type semiconductor layer, and the other is an n-type semiconductor layer.

In one or more embodiments, the first semiconductor layer 11 is not limited to a perovskite-type crystal material or a silicon-based material, and various semiconductor thin-films usable as a photoelectric conversion layer can be used. A charge transport layer and conductive semiconductor layers 14 and 15 adjacent to the first semiconductor layer 11 can be appropriately selected according to the material of the photoelectric conversion layer, and the like.

The second photoelectric conversion unit 20 includes a second semiconductor layer as a photoelectric conversion layer 21. The second semiconductor layer absorbs light to generate photocarriers. The second semiconductor layer 21 has a band gap different from that of the first semiconductor layer 11. Thus, the first semiconductor layer 11 and the second semiconductor layer 21 have spectral sensitivity characteristics in different wavelength ranges. Thus, light having a wavelength in a wider range can be involved in photoelectric conversion in a stacked photoelectric conversion unit in which the first photoelectric conversion unit 10 including the first semiconductor layer 11 as a photoelectric conversion layer and the second photoelectric conversion unit 20 including the second semiconductor layer 21 as a photoelectric conversion layer are stacked. When the first semiconductor layer 11 has a band gap wider than that of the second semiconductor layer 21, the light-receiving surface is on the first photoelectric conversion unit 10 side.

The second semiconductor layer 21 may be either a semiconductor thin-film or a semiconductor substrate. Examples of the semiconductor thin-film are as described above. Examples of the semiconductor substrate include silicon substrates of single-crystalline silicon, polycrystalline silicon, or the like, and crystalline semiconductor substrates of germanium, gallium nitride, or the like.

When the second semiconductor layer 21 is a single-crystalline silicon substrate, examples of the second photoelectric conversion unit 20 include diffusion-type cells in which a diffusion layer of second conductivity-type is formed on the light-receiving side of a single-crystalline silicon substrate of first conductivity-type, and heterojunction cells in which a silicon-based thin-film is disposed on both surfaces of a single-crystalline silicon substrate of first conductivity-type.

The heterojunction cell 20 including a single-crystalline silicon substrate as the second semiconductor layer 21, and including a silicon-based thin-film on both surfaces of the single-crystalline silicon substrate has conductive silicon-based thin-films 24 and 25. The single-crystalline silicon substrate 21 may be either a p-type single-crystalline silicon substrate or an n-type single-crystalline silicon substrate. Since comparison between a hole and an electron shows that the electron has a higher mobility excellent conversion characteristics are exhibited particularly when an n-type single-crystalline silicon substrate is used. One of the conductive silicon-based thin-films 24 and 25 is a p-type silicon-based thin-film, and the other is an n-type silicon-based thin-film.

In one or more embodiments, the second photoelectric conversion unit 20 is connected to the first photoelectric conversion unit 10 in series. Thus, the conductivity-types of the conductive silicon-based thin-films 24 and 25 are selected so that the rectification directions of first photoelectric conversion unit 10 and the second photoelectric conversion unit 20 are identical to each other. For example, when the first photoelectric conversion unit 10 is a perovskite cell, the charge transport layer 14 on the first electrode 51 side is a hole transport layer, and the charge transport layer 15 on the second photoelectric conversion unit 20 side is an electron transport layer, the conductive silicon-based thin-film 24 on the first photoelectric conversion unit 10 side in the second photoelectric conversion unit 20 is a p-type conductive silicon-based thin-film, and the other conductive silicon-based thin-film 25 in the second photoelectric conversion unit 20 is an n-type conductive silicon-based thin-film. The same applies when the first photoelectric conversion unit has a pin or pn semiconductor junction from the first electrode 51 side.

It is preferable that intrinsic silicon-based thin-films 22 and 23 are disposed between the single crystalline silicon substrate 21 and the conductive silicon-based thin-films 24 and 25, respectively. By providing the intrinsic silicon-based thin-film on the surface of the single-crystalline silicon substrate, surface passivation can be effectively performed while diffusion of impurities to the single-crystalline silicon substrate is suppressed. Disposing intrinsic amorphous silicon thin-films as the intrinsic silicon-based thin-films 22 and 23 on the surfaces of the single-crystalline silicon substrate 21 can enhance the passivation effect on the surfaces of the single-crystalline silicon substrate 21.

An intermediate layer 13 may be disposed between the first photoelectric conversion unit 10 and the second photoelectric conversion unit 20. The intermediate layer 13 is provided for adjustment of a band gap between two photoelectric conversion units stacked, selective movement of carriers, formation of a tunnel junction, wavelength selective reflection, and so on. The configuration of the intermediate layer is selected according to the type, combination, and the like of the photoelectric conversion units 10 and 20. When a function as an intermediate layer is imparted to the conductive semiconductor layers (or charge transport layers) 15 and 24 disposed at the interface between the first photoelectric conversion unit 10 and the second photoelectric conversion unit 20, the intermediate layer may be omitted.

Preferably the first electrode 50 on a surface on the first photoelectric conversion unit 10 side and the second electrode 55 on a surface on the second photoelectric conversion unit 20 side are disposed on substantially the entire surface of the photoelectric conversion unit for effectively extracting photoproduction carriers. The electrode disposed on a surface on the light-receiving side is preferably a transparent electrode. In other words, when the first photoelectric conversion unit 10 is a top cell on the light-receiving side, the first electrode 50 is preferably a transparent electrode. The electrode on the rear side may be either a transparent electrode or a metal electrode. As a material of the transparent electrode, a metal oxide such as ITO, zinc oxide or tin oxide is preferably used. As a material of the metal electrode, silver, copper, aluminum, or the like is preferably used.

[Method for Manufacturing Multi-Junction Photoelectric Conversion Device]

In the manufacturing method according to one or more embodiments of the present invention, a patterned first electrode is disposed on a surface of a first photoelectric conversion unit of a stacked unit in which the first photoelectric conversion unit and a second photoelectric conversion unit are stacked, and reverse bias processing is performed in a state in which the patterned electrode is electrically separated.

Embodiment 1

Hereinafter, with reference to FIGS. 4A to 4F, one or more embodiments of a method for manufacturing a multi-junction photoelectric conversion device 100 shown in FIGS. 1 and 2 will be described.

(Preparation of Multi-Junction Photoelectric Conversion Unit)

Figure 4A:
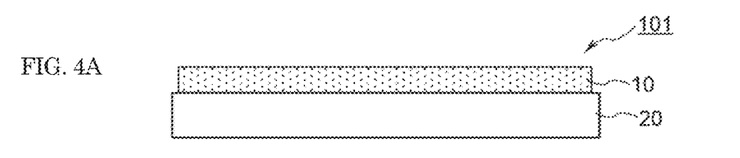
FIGS. 4A to 4F are process conceptual diagrams of one example of a process for manufacturing a multi-junction photoelectric conversion device.

First, as shown in FIG. 4A, a stacked unit 101 is prepared in which a first photoelectric conversion unit 10 and a second photoelectric conversion unit 20 are stacked and connected in series. When a photoelectric conversion layer of the second photoelectric conversion unit 20 is a semiconductor substrate such as a silicon substrate, it is preferable to form the first photoelectric conversion unit 10 stacking on the second photoelectric conversion unit 20.

When a semiconductor substrate such as a silicon substrate is used as the photoelectric conversion layer of the second photoelectric conversion unit, there are no pinholes and the like in the photoelectric conversion layer. On the other hand, since the photoelectric conversion layer of the first photoelectric conversion unit 10 is a thin-film, defects such as pinholes are unavoidably generated during deposition.

(Formation of Electrode)

Figure 4B:
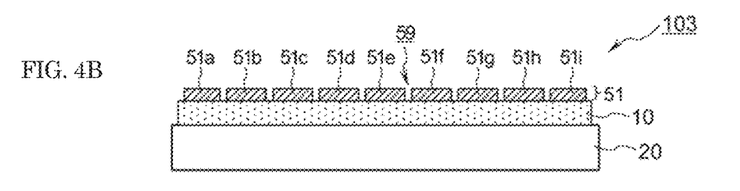

As shown in FIG. 4B, a first electrode 51 is formed on the first photoelectric conversion unit 10. When defects such as pinholes exist in the first photoelectric conversion unit, an electroconductive material of the first electrode comes into contact with the defective portions, or the electroconductive material is embedded in the pinholes, resulting in formation of a leakage portion.

The first electrode 51 is separated by a separation groove 59, and has a plurality of regions 51a to 51i. Examples of the method for forming a patterned electrode include a method in which patterning is performed during deposition; and a method in which after formation of an electrode layer, a separation groove is formed, and patterning is performed. Examples of the method for forming a patterned electrode include a method in which a film is deposited while a separation groove 59-formed region on the first photoelectric conversion unit 10 is covered with a mask. Examples of the method for forming the separation groove 59 after formation of an electrode layer include a method in which an electrode layer in a separation groove-formed region is eliminated by wet etching or the like (pattern etching); and a method in which an electrode layer is irradiated with laser light.

A second electrode (not shown) may be disposed on a surface on the second photoelectric conversion unit 20 side. When photoirradiation is performed from the second photoelectric conversion unit 20 side during reverse bias processing, preferably, the second electrode is a transparent electrode. When light can reach the second photoelectric conversion unit, a metal electrode may be provided as the second electrode. For example, a patterned metal electrode such as a finger electrode or a bus bar electrode may be disposed on the transparent electrode. In addition, the second electrode may have a stacking structure of a transparent electrode and a metal electrode with the metal electrode disposed on the transparent electrode after reverse bias processing.

Figure 4C:
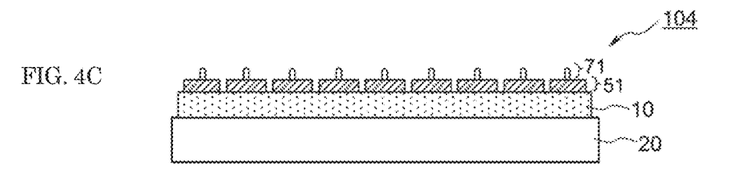

As shown in FIG. 4C, a finger electrode 71 is disposed on each region of the patterned first electrode 51. The finger electrode is provided for extracting carriers, which have reached the first electrode 51 from the photoelectric conversion layer, to the outside. In addition, in the present embodiment, the finger electrode 71 is used as a power supply electrode during reverse bias processing. When the first electrode 51 is a transparent electrode, a potential difference in the surface of the electrode is reduced by providing the metallic finger electrode 71. Thus, in reverse bias processing, a uniform voltage can be applied over the entire region of each of electrodes 51a to 51i, and leakage can be uniformly eliminated irrespective of the distance from the power supply point.

As a material of the finger electrode, a low-resistance metallic material such as silver, copper, or aluminum is preferably used. The finger electrode is formed in a pattern shape by a method in which an electroconductive paste is applied; a plating method; or the like.

The finger electrode 71 is provided so as to maintain a state in which a plurality of regions 51a to 51i of the first electrode 51 are electrically separated. In other words, the finger electrode 71 is disposed so as not to overlap the separation groove 59. Preferably the finger electrode 71 is disposed so as to extend in parallel with the separation groove 59 as shown in FIG. 1.

(Reverse Bias Processing)

Figure 4D:
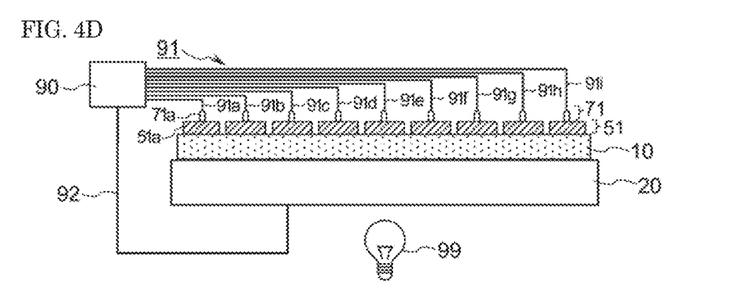

Leakage in the first photoelectric conversion unit 10 is eliminated by reverse bias processing in a state in which the first electrode 51 disposed on the first photoelectric conversion unit 10 is separated into a plurality of regions 51a to 51i. FIG. 4D is a conceptual diagram of a reverse bias processing step.

In the form shown in FIG. 4D, each of finger electrodes 71 disposed in regions of the first electrode 51 is connected to a power supply 90 through a wire 91, and the second photoelectric conversion unit 20 is connected to the power supply 90 through a wire 92. When a second electrode 55 is formed on a surface of the second photoelectric conversion unit 20 as in the stacked-layer form shown in FIG. 3, it is preferable that the wire 92 be connected to the second electrode. The power supply 90 is configured such that power can be supplied to any of a plurality of wires 91a to 91i.

In reverse bias processing, a stack of the first photoelectric conversion unit 10 and the second photoelectric conversion unit 20 is irradiated with light from a light source 99. The light source 99 is not particularly limited as long as it outputs light in such a wavelength range that the second semiconductor layer as a photoelectric conversion layer of the second photoelectric conversion unit 20 can absorb the light, and it is capable of uniformly irradiating the second photoelectric conversion unit with light. Examples of the light source include LEDs and halogen lamps. The light source may be a pulsed light source. A wavelength selection filter (not shown) may be arranged between the light source 99 and the stacked unit to adjust the wavelength range of light applied to the photoelectric conversion unit.

Light from the light source 99 is applied preferentially to the second photoelectric conversion unit 20 over the first photoelectric conversion unit 10. That is, light is applied so as to generate a larger photocurrent in the second photoelectric conversion unit 20 than in the first photoelectric conversion unit 10. For example, by applying light having a wavelength at which the light is absorbed in a small amount in the first photoelectric conversion unit, and absorbed in a large amount in the second photoelectric conversion unit, the second photoelectric conversion unit can be preferentially irradiated with light. For example, a perovskite semiconductor layer hardly absorbs light having a wavelength longer than 800 nm, and therefore by applying infrared light having a wavelength longer than 800 nm to a multi-junction unit including a perovskite cell as the first photoelectric conversion unit 10, and a crystalline silicon cell as the second photoelectric conversion unit 20, the second photoelectric conversion unit can be preferentially irradiated with light.

In addition, also when a white light source is used as the light source 99, application of light from the second photoelectric conversion unit (crystalline silicon cell) 20 side causes most of the light to be absorbed by the crystalline silicon substrate of the crystalline silicon cell 20, and thus prevented from reaching the perovskite cell 10, so that the crystalline silicon cell can be preferentially irradiated with light. Thus, when the first semiconductor layer of the first photoelectric conversion unit 10 has a band gap wider than that of the second semiconductor layer of the second photoelectric conversion unit 20, i.e., in the case where the first photoelectric conversion unit 10 and the second photoelectric conversion unit 20 are top cell and bottom cell, respectively in a multi-junction unit, the second photoelectric conversion unit can be preferentially irradiated with light by applying light from the second photoelectric conversion unit 20 side (the rear side during power generation).

A reverse bias voltage is applied from the power supply 90 to the stacked unit while the second photoelectric conversion unit is preferentially irradiated with light to generate photocarriers. When a p-type semiconductor (or hole transport layer) is on the first electrode side, i.e., the stacked unit is a p-front-type stacked unit, a voltage is applied in such a manner that the first electrode 51 on the first photoelectric conversion unit 10 is negative, and the second photoelectric conversion unit 20 side is positive. In the case of an n-front type, a voltage is applied in such a manner that the first electrode 51 is positive, and the second photoelectric conversion unit 20 side is negative.

When a reverse bias voltage is applied, a current locally passes into a leakage portion in the first photoelectric conversion unit, leading to recombination with photocarriers generated in the second photoelectric conversion unit. Thus, when a reverse bias voltage is applied while the second photoelectric conversion unit is preferentially irradiated with light, a current passes between the front and rear electrodes that sandwich the photoelectric conversion units 10 and 20. In the second photoelectric conversion unit, a current passes through the entire surface because a photocurrent is caused to pass by photoirradiation, whereas in the first photoelectric conversion unit, a current is caused to pass by a reverse bias voltage. Thus, in the first photoelectric conversion unit, a current locally passes into a portion where leakage occurs, and thus heat is generated, so that the leakage portion is insulated by oxidation or melting, resulting in elimination of leakage.

Figure 4E:
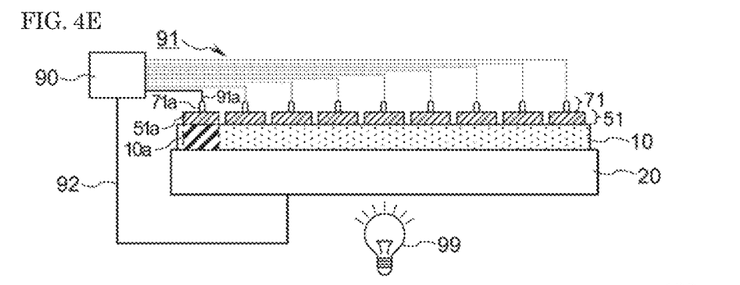

In one or more embodiments of the present invention, a reverse bias voltage is applied between a specific region of the first electrodes 51a to 51i obtained by dividing the first electrode into a plurality of regions and the second photoelectric conversion unit. As described above, the power supply 90 is configured such that a voltage can be applied to any of a plurality of wires 91a to 91i, and therefore a reverse bias voltage can be selectively applied between a specific region of the first electrode divided into a plurality of regions and the second photoelectric conversion unit. FIG. 4E schematically shows a case in which a reverse bias voltage is applied between the wire 91a connected to the finger electrode 71a and the wire 92 while light is irradiated from the second photoelectric conversion unit 20 side, so that leakage in the region 10a of the first photoelectric conversion unit existing under the electrode 51a is eliminated.

Here, a voltage is applied to the electrode 51a in the first electrode 51 divided into nine regions 51a to 51h in the drawing. Since a voltage is applied between the second photoelectric conversion unit 20 and the electrode 51a, a reverse bias current locally passes into a leakage portion existing in the region 10a of the first photoelectric conversion unit existing under the electrode 51a, so that leakage in the region 10a is eliminated. In contrast, in regions other than the region 10a of the first photoelectric conversion unit 10, a reverse bias voltage is not applied, and therefore even when a leakage portion exists, a reverse bias current does not pass, and thus leakage is not eliminated.

A voltage is applied from the power supply 90 to the electrode 51a through the wire 91a to eliminate leakage in the region 10a just below the electrode 51a, and a voltage is then sequentially applied to electrodes 51b to 51i through wires 91b to 91i to eliminate leakage in the photoelectric conversion unit existing under respective small-area regions.

When a large number of leakage portions existing over the entire surface of the photoelectric conversion unit are to be eliminated at a time, it is necessary that a reverse bias current necessary for elimination of leakage pass into each leakage portion, so that the total current amount may increase, leading to expansion of pinholes and breakage of an element. On the other hand, in one or more embodiments of the present invention, leakage in a region just below the electrode 51a is selectively eliminated by selectively applying a reverse bias voltage to the electrode 51a divided into small-area parts, so that the total current amount is not excessively large, and thus expansion of the pinhole and breakage of an element can be suppressed.

When a plurality of cells separated by a separation groove are connected in series in an in-plane direction to form an array, a reverse bias current passes through the whole array connected in series, and therefore it is difficult to positionally selectively eliminate leakage. For eliminating leakage in a specific region, it is necessary that a reverse bias current be caused to pass exclusively into a leakage portion with a photocurrent generated by selectively applying light to a region to be subjected to elimination of leakage in such a manner that the photoelectric conversion unit in the specific region does not behave as a resistor. Thus, it is necessary to adjust the relative position between the light source and the multi-junction photoelectric conversion unit. On the other hand, in one or more embodiments of the method according to the present disclosure in which the photoelectric conversion unit is not separated, and reverse bias processing is performed with only electrodes separated from one another, adjustment of the relative position with the light source is not required at the time of changing a region to which a reverse bias voltage is applied. Thus, the method of one or more embodiments of the present invention are excellent in workability in sequential reverse bias processing of a plurality of separated small-area regions.

In addition, in the method of one or more embodiments of the present invention, it is not necessary to pattern the photoelectric conversion layer, and therefore a decrease in light-receiving area of the photoelectric conversion layer is small. Thus, a multi-junction photoelectric conversion device, which generates a large amount of power and which hardly suffers deterioration of characteristics due to leakage in a thin-film, can be obtained.

(Electrical Connection of First Electrode)

Preferably a plurality of regions 51a to 51i of the first electrode, which are separated from one another, are electrically connected after leakage in the first photoelectric conversion unit is eliminated by reverse bias processing. Examples of the method for electrically connecting first electrodes separated from one another include a method in which the separation grooves 59 is filled with an electroconductive material to bring separated small-area electrodes 51a to 51i into conduction with one another; and a method in which an electroconductive material is disposed on the first electrode so as to extend over a plurality of regions.

Examples of the electroconductive material disposed on the first electrode so as to extend over a plurality of regions include various electrode materials, and wiring members such as interconnectors. Such an electroconductive material may be disposed so as to be in contact with the first electrode 51, or disposed so as to be in conduction with the electrode 51 through another electrode or the like. For reducing a current collection loss, the electroconductive material disposed on the first electrode is preferably a low-resistance metallic material.

Figure 4F:
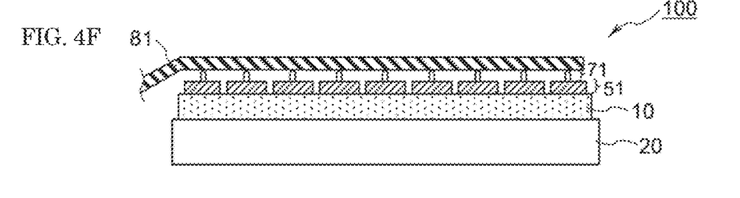

In FIG. 4F, an interconnector 81 for electrically connecting adjacent cells is connected to the finger electrode 71 on the first electrode 51, so that a plurality of regions 51a to 51i of the first electrode, which are separated from one another by the separation groove 59, are electrically connected. The finger electrode 71 and the interconnector 81 are electrically connected using solder, an electroconductive adhesive, or the like.

When in an operation of connecting the finger electrode 71 to the interconnector 81, an electroconductive material such as solder or an electroconductive adhesive flows out into the separation groove that separates the first electrode 51, the electroconductive material may come into contact with the photoelectric conversion unit, resulting in a failure such as leakage. Particularly, when the separation groove 59 extends to the inside of the first photoelectric conversion unit 10, ingress of the electroconductive material into the separation groove may cause critical leakage, and therefore it is necessary to pay attention to prevent ingress of the electroconductive material into the separation groove.

Embodiment 2

As in one or more embodiments shown in FIG. 5, contact between a photoelectric conversion unit 10 and an electroconductive material may be prevented by filling a separation groove 59 with an insulating material before connection of an electroconductive member. FIGS. 5A to 5F are process conceptual diagrams of one or more embodiments of the manufacturing method according to the present disclosure. In one or more embodiments, an interconnector 81 is mounted after the separation groove 59 is filled with the insulating material. First, a stacked unit 111 of the first photoelectric conversion unit 10 and a second photoelectric conversion unit 20 is prepared. The stacked unit is the same as the stacked unit 101 in FIG. 4A.

Figure 5A:
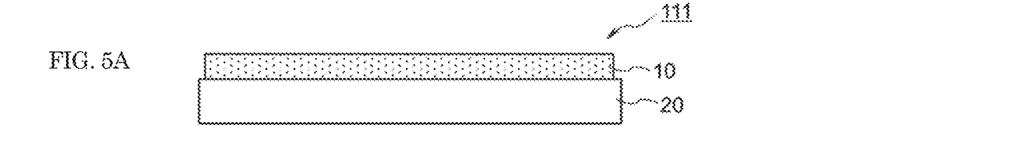
FIGS. 5A to 5F are process conceptual diagrams of one example of a process for manufacturing a multi-junction photoelectric conversion device.
Figure 5B:
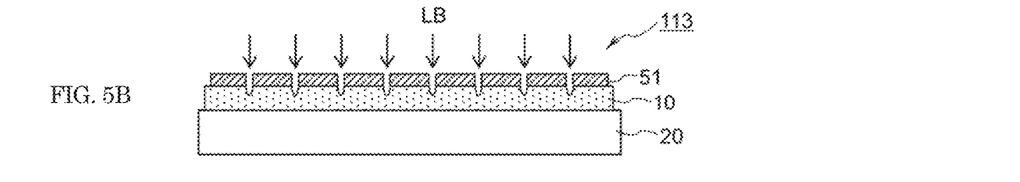

Next, a first electrode layer is formed on the first photoelectric conversion unit 10, and the separation groove 59 is formed by applying laser light LB, so that a first electrode is patterned in a plurality of small-area regions. For electrically separating the electrode layer, it is necessary to form the separation groove so as to extend to the interface between an electrode 51 and the photoelectric conversion unit 10. It is difficult to stop formation of the separation groove at the interface portion, and therefore for reliably separating the electrode, the separation groove 59 is formed so as to extend to the photoelectric conversion unit 10 as shown in FIG. 5B. Preferably, the separation groove 59 does not extend to the second photoelectric conversion unit 20.

Figure 5C:
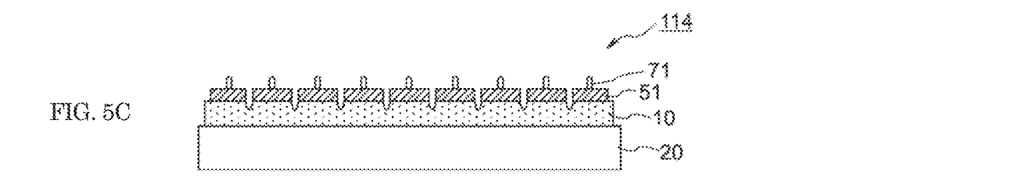
Figure 5D:
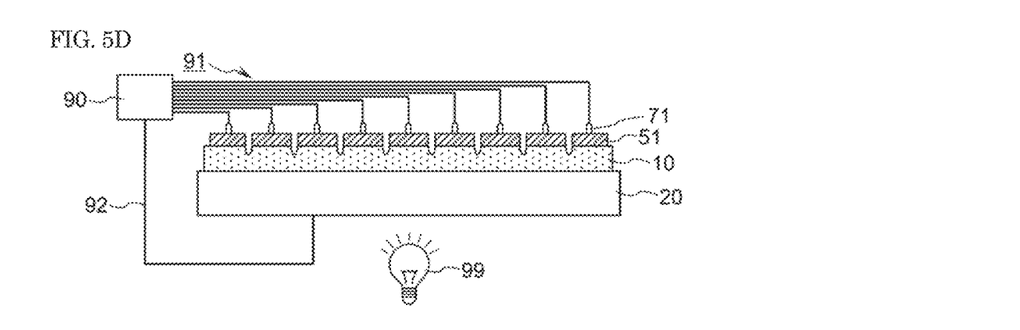

After formation of the separation groove, the finger electrode 71 is formed on the first electrode 51 (FIG. 5C). Thereafter, as in the case of the above-described embodiment, leakage in the first photoelectric conversion unit 10 is eliminated by applying a reverse bias voltage while preferentially irradiating the second photoelectric conversion unit 20 with light from a light source 99 (FIG. 5D).

Thereafter, a plurality of regions of the first electrode are electrically connected by disposing an electroconductive material so as to extend over a plurality of regions of the first electrode. Examples of the electroconductive material disposed so as to extend over a plurality of regions of the first electrode include wiring members (interconnectors) for interconnection, and bus bar electrodes. FIG. 5F shows an example in which a plurality of finger electrodes 71 are connected by the interconnector 81.

Figure 5E:
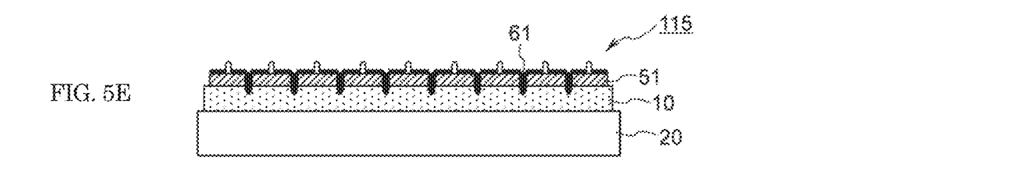
Figure 5F:
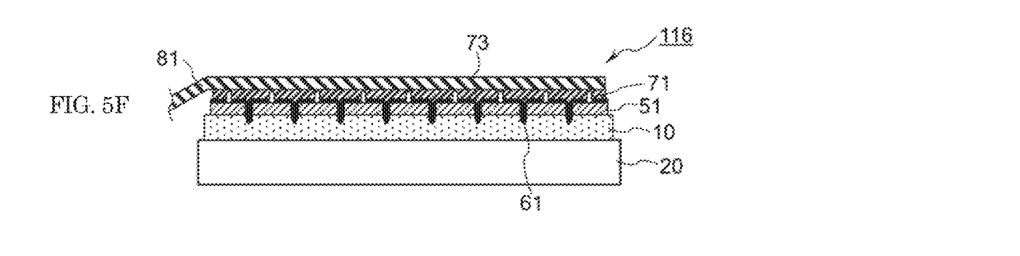

In one or more embodiments, an insulating layer 61 is formed, and the separation groove 59 is filled with an insulating material as shown in FIG. 5E before the interconnector or bus bar electrode is provided so as to extend over a plurality of regions of the first electrode. By filling the separation groove 59 with the insulating material, an exposed portion of the photoelectric conversion unit is protected with the insulating material even when the separation groove formed by laser processing or the like extends to the photoelectric conversion unit 10. Thus, a metallic material constituting the bus bar electrode, or the electroconductive material used for connecting the interconnector does not enter the separation groove to come into contact with the photoelectric conversion unit 10, and thus occurrence of leakage due to the electroconductive material is suppressed.

Figure 6:
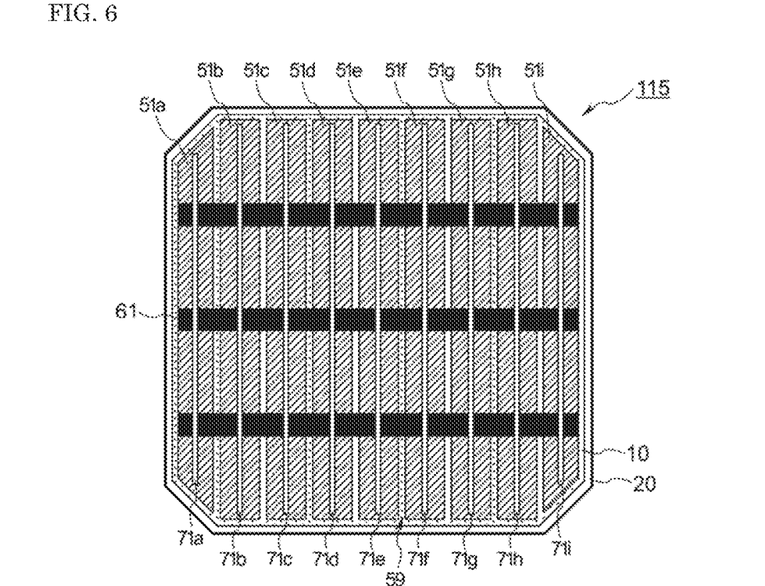
FIG. 6 is a plan view of a stacked unit in which a separation groove is filled with an insulating material.

The insulating layer 61 may be disposed in such a manner that the insulating material fills the separation groove in the region where the interconnector 81 is to be arranged thereover. FIG. 6 is a plan view of a stacked unit 115 in FIG. 5E, where the insulating layer 61 is formed in a belt-shape extending in a direction perpendicular to the separation groove 59. The finger electrode 71 is not embedded in the insulating layer 61, and thus is exposed.

As shown in FIG. 5F, the interconnector 81 is disposed on the finger electrode 71 to electrically connect a plurality of finger electrodes. Preferably the interconnector 81 is arranged in an insulating layer-formed region with a width smaller than that of the insulating layer 61. By forming the insulating layer 61 with a width larger than that of the interconnector 81, ingress of the electroconductive material into the separation groove during interconnection can be more reliably prevented.

Although FIG. 6 shows one or more embodiments in which the insulating layer 61 is formed in a belt-shape, the shape of the insulating layer is not particularly limited as long as the separation groove is filled with an insulating material in a region where a bus bar electrode or interconnector for electrically connecting the patterned first electrode is arranged. For example, when the separation groove is filled with an insulating material, the insulating material is not required to be disposed on the first electrode 51. In addition, when the insulating material is light-transmissive, an insulating layer may be disposed on the entire surface except a finger electrode 71-formed region.

Although FIG. 5 shows one or more embodiments in which the separation groove 59 is filled with an insulating material after reverse bias processing, the separation groove may be filled with the insulating material before reverse bias processing.

Embodiment 3

In each of the above-described embodiments, the finger electrodes 71 disposed on each of a plurality of regions of the first electrode 51, which are separated from one another, are connected through an interconnector or bus bar electrode, so that a plurality of regions of the first electrode are electrically connected. As another embodiment, a separation groove separating a first electrode 51 may be filled with an electroconductive material such as a metal or a conductive oxide to electrically connect a plurality of regions of the first electrode.

FIGS. 7A to 7E are process conceptual diagrams of one or more embodiments in which a plurality of regions of the first electrode are electrically connected by filling a separation groove 59 with a conductive oxide.

Figure 7A:
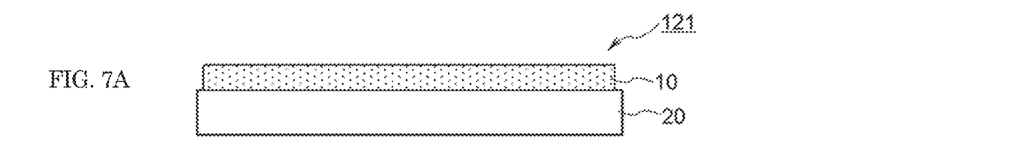
FIGS. 7A to 7E are process conceptual diagrams of one example of a process for manufacturing a multi-junction photoelectric conversion device.
Figure 7B:
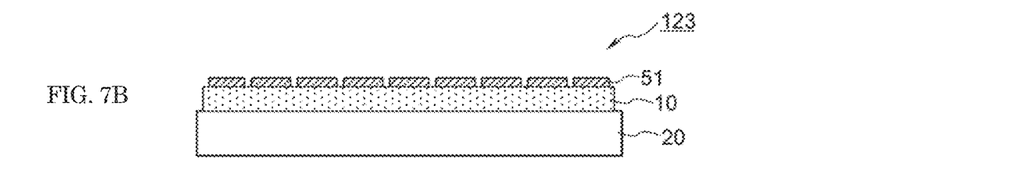

First, as in FIG. 4A, a stacked unit 121 of a first photoelectric conversion unit 10 and a second photoelectric conversion unit 20 is prepared (FIG. 7A), and as in FIG. 4B, a first electrode 51 patterned by the separation groove 59 is formed (FIG. 7B). In one or more embodiments, the separation groove is filled with an electroconductive material after elimination of leakage by reverse bias processing, and therefore it is preferable that the separation groove 59 do not extend to the inside of the first photoelectric conversion unit 10. It is therefore preferable that the separation groove 59 be formed by mask deposition or pattern etching.

Figure 7C:
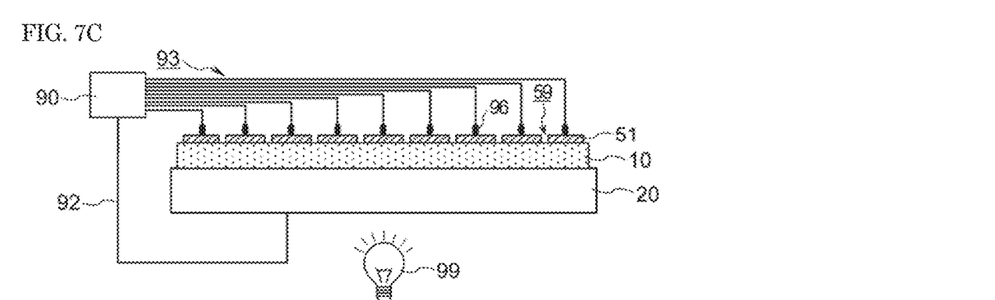

Leakage is eliminated by reverse bias processing with the patterned first electrode 51 disposed on the photoelectric conversion unit 10 (FIG. 7C). In one or more embodiments, a metal electrode is not formed on the first electrode 51, and therefore a wire 93 from a power supply 90 is connected onto the first electrode 51. Leakage in the first photoelectric conversion unit 10 is eliminated by applying a reverse bias voltage while preferentially irradiating the second photoelectric conversion unit 20 with light from a light source 99.

For facilitating electrical connection between the first electrode 51 and the wiring, the wire 93 may be equipped with a probe electrode 96 at the tip. The shape of the probe electrode is not particularly limited. When the probe electrode has a plate shape, the applied voltage can be made uniform because the contact area between the first electrode and the probe electrode is large, and the potential in the surface is uniform.

Figure 7D:
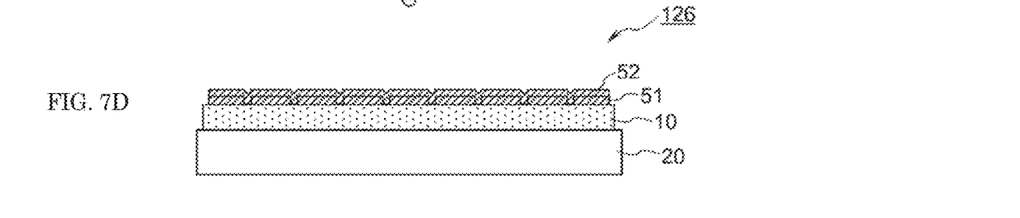

After elimination of leakage by reverse bias processing, the separation groove 59 is filled with an electroconductive material, so that a plurality of regions of the first electrode are electrically connected. In FIG. 7D, a transparent electroconductive layer 52 is deposited on the patterned first electrode 51 to fill the separation groove 59 with a transparent electroconductive material that forms the transparent electroconductive layer. Preferably the transparent electroconductive layer 52 is not patterned, and is formed on the entire surface of each of the first electrode 51 and the separation groove 59.

After the separation groove 59 is filled with the electroconductive material, elimination of leakage by application of a reverse bias voltage (second reverse bias processing) may be further performed. As shown in FIG. 7C, a reverse bias voltage is sequentially applied to each region of the patterned electrode 51 to eliminate leakage in the first photoelectric conversion unit 10, so that leakage in the photoelectric conversion unit 10 under a first electrode 51-formed region is eliminated (first reverse bias processing). On the other hand, since reverse bias processing is not performed under a separation groove 59-formed region, a leakage portion may remain. After the separation groove is filled with the electroconductive material, second reverse bias processing is performed by applying a reverse bias voltage between the second photoelectric conversion unit electrically connected to the power supply 90 through the wire 92 and the first electrode 51 electrically connected to the power supply 90 through the wire 94, so that leakage remaining in the first photoelectric conversion unit under the separation groove 59-formed region can be eliminated. In the second reverse bias processing after the separation groove 59 is filled with the electroconductive material, a reverse bias voltage is applied while the second photoelectric conversion unit 20 is preferentially irradiated with light from a light source 99, as in the first reverse bias processing.

Figure 7E:
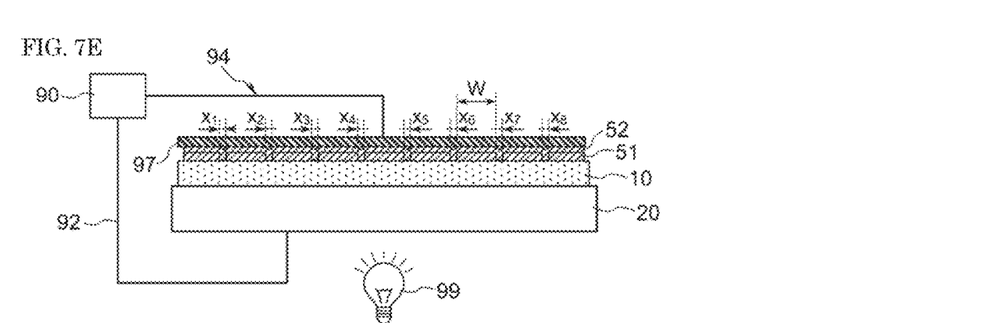

Since a plurality of regions of the first electrode 51 are electrically connected, a reverse bias voltage is applied to the entire region on the first photoelectric conversion unit 10 in the second reverse bias processing. For reducing a potential difference in the surface, a reverse bias voltage may be applied through a metal plate 97 connected to the wire 94 as shown in FIG. 7E. In addition, a potential difference in the surface may be reduced by applying a reverse bias voltage after a metal electrode such as a finger electrode or a bus bar electrode is disposed on the transparent electroconductive layer 52.

Leakage in the first photoelectric conversion unit 10 under the first electrode 51-formed region is eliminated by the foregoing first reverse bias processing, and therefore in the second reverse bias processing after the separation groove 59 is filled with the electroconductive material, a current passes only through a leakage portion remaining in the separation groove-formed region even though a reverse bias is applied to the entire surface. Thus, it is possible to eliminate leakage under the separation groove-formed region without passage of an excessively large current.

The area of a region to be subjected to elimination of leakage in the second reverse bias processing is preferably comparable to the area of one region of the first electrode 51 separated by the separation groove. This can prevent a situation in which the total amount of currents for elimination of leakage is excessively large when a reverse bias voltage is applied to the entire surface. The area of the region to be subjected to elimination of leakage is substantially equal to the total of the areas of the separation grooves filled with the electroconductive material. When the first electrode 51 is patterned in stripe, it is preferable that the width W of one region of the first electrode be substantially equal to the total of the widths $x_1$ to $x_8$ of the separation grooves. Specifically, the total of the widths of the separation grooves is preferably not more than twice the width W of one region of the first electrode.

When the area of the region to be subjected to elimination of leakage in the second reverse bias processing is comparable to the area of one region of the first electrode 51, passage of an excessively large current is not required for elimination of leakage because the total current amount in the second reverse bias processing is comparable to the current amount in application of a reverse bias voltage to each electrode region in the first reverse bias processing.

After the second bias processing, formation of a metal electrode such as a finger electrode or a bus bar electrode and connection of the interconnector on the metal electrode may be performed.

Embodiment 4

Figure 8A:
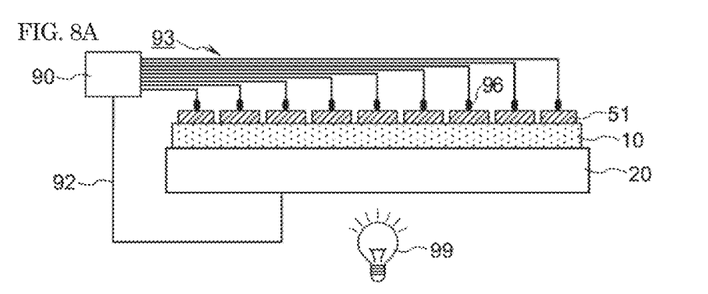
FIGS. 8A to 8D are process conceptual diagrams of one example of a process for manufacturing a multi-junction photoelectric conversion device.

FIGS. 8A to 8D are process conceptual diagrams of one or more embodiments in which a plurality of regions of the first electrode are electrically connected by filling a separation groove 59 with a metallic material. First, as in FIGS. 7A to 7C, a stacked unit of a first photoelectric conversion unit 10 and a second photoelectric conversion unit 20 is prepared, a first electrode 51 patterned by the separation groove 59 is formed, and first reverse bias processing is performed (FIG. 8A).

Figure 8B:
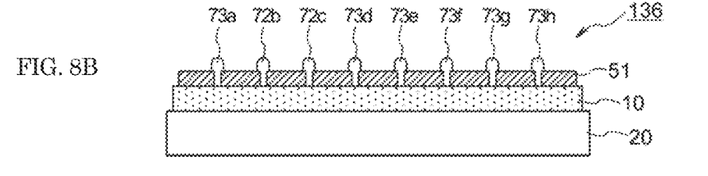
Figure 9:
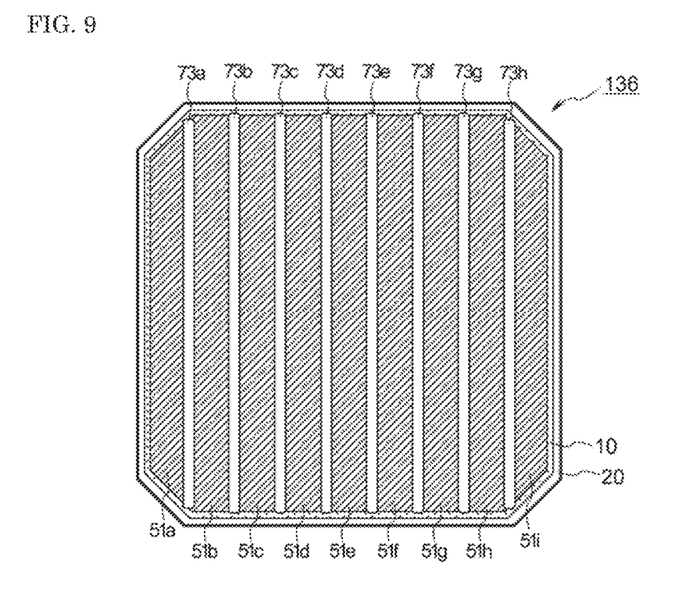
FIG. 9 is a plan view of a stacked unit in which a finger electrode is disposed so as to fill a separation groove.

After the first reverse bias processing, the separation groove 59 is filled with a metallic material. In FIG. 8B, a finger electrode 73 is formed so as to fill the separation groove 59. FIG. 9 is a plan view of a stacked unit 136 in FIG.

8B in which finger electrodes 73a to 73h are formed so as to fill the separation groove. Preferably, the finger electrode 73 is formed over substantially the entire length of the separation groove 59. In addition, it is preferable that the finger electrode 73 be formed to have a width larger than that of the separation groove 59. When the finger electrode 73 is formed to have a width larger than that of the separation groove, the separation groove 59 is filled with a metallic material to electrically connect regions of the patterned first electrode, and the contact area between the finger electrode and the first electrode can be increased to improve carrier collection efficiency.

Figure 8C:
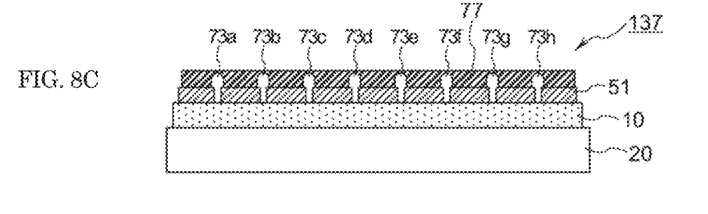
Figure 10:
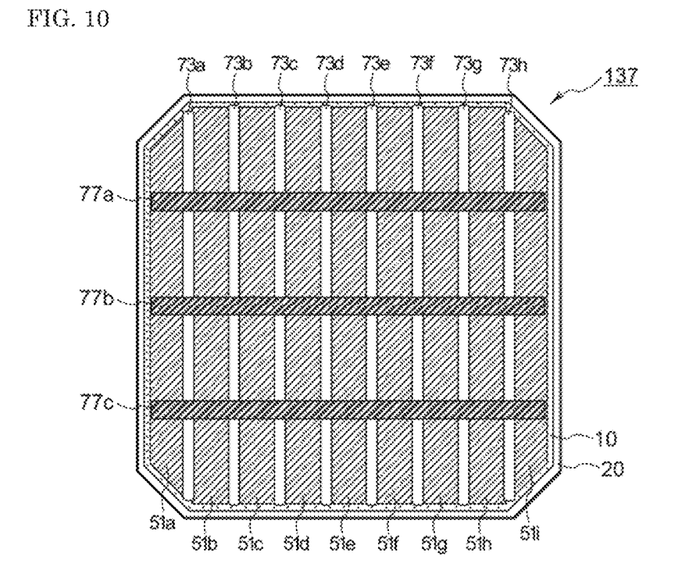
FIG. 10 is a plan view of a stacked unit in which a bus bar electrode is disposed so as to connect the finger electrode of the stacked unit of FIG. 9.

After formation of the finger electrode, a bus bar electrode 77 extending in a direction perpendicular to the finger electrode 73 is formed (FIG. 8C). FIG. 10 is a plan view of a stacked unit 137 after formation of the bus bar electrode 77. By forming bus bar electrodes 77a to 77c on finger electrodes 73a to 73h, a plurality of finger electrodes are electrically connected. As a material of the bus bar electrode, a low-resistance metallic material such as silver, copper or aluminum is preferably used. The bus bar electrode is formed by a printing method, a plating method, or the like. Although FIGS. 8B and 8C show an example in which the bus bar electrode 77 is formed after the formation of the finger electrode 73, the bus bar electrode and the finger electrode may be formed simultaneously.

Figure 8D:
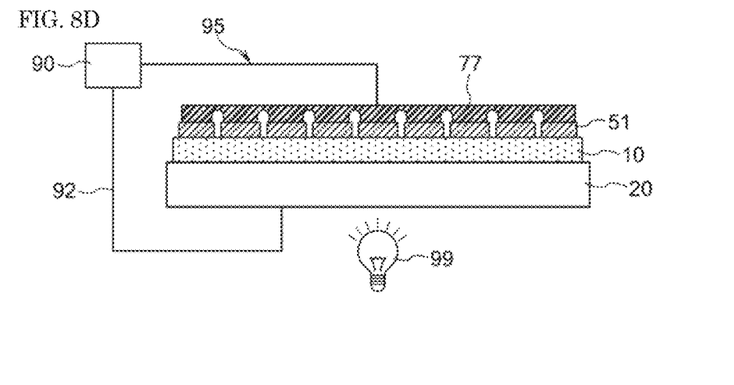

After formation of the bus bar electrode, remaining leakage in the photoelectric conversion unit 10 under a separation groove 59-formed region may be eliminated by performing second reverse bias processing while preferentially irradiating the second photoelectric conversion unit 20 with light from a light source 99 as in the case of the embodiment 3. In FIG. 8D, a wire 95 from a power supply 90 is connected to the bus bar electrode 77. In one or more embodiments, power is supplied from the bus bar electrode 77 to the finger electrode 71 to apply a reverse bias voltage between the finger electrode 71 and the second photoelectric conversion unit, so that leakage remaining in the first photoelectric conversion unit under a finger electrode 71-formed region (separation groove 59-formed region) is eliminated.

The second bias processing may be performed before the formation of the bus bar electrode. In this case, the wire from the power supply 90 may be connected to the finger electrode 71 to supply power, or a metal plate or the like connected to the wire may be brought into contact with a plurality of finger electrodes to supply power to the finger electrodes.

An interconnector may be mounted on the bus bar electrode 77. The interconnector electrically connected to the bus bar electrode is electrically connected to an adjacent photoelectric conversion device to modularize the photoelectric conversion devices.

Each of the embodiments 1 to 4 is illustrative, and constituent elements such as electrodes and electroconductive materials which form the multi-junction photoelectric conversion devices, steps, and so on in the embodiments can be appropriately combined to carry out the manufacturing method according to one or more embodiments of the present invention.

In practical use of the photoelectric conversion devices, it is preferable that the multi-junction photoelectric conversion device, in which leakage in the thin-film photoelectric conversion layer of the first photoelectric conversion unit is eliminated by the method according to one or more embodiments of the present invention, be encapsulated by an encapsulant to be modularized. Modularization of photoelectric conversion devices may be performed by an appropriate method. For example, adjacent cells are electrically connected in series or in parallel through an interconnector, and then encapsulated with an encapsulant and a glass plate.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE CHARACTERS 10 first photoelectric conversion unit
11 first semiconductor layer (photoelectric conversion layer)
20 second photoelectric conversion unit
21 second semiconductor layer (photoelectric conversion layer)
50, 51 first electrode
59 separation groove
55 second electrode
61 insulating layer
71, 73 finger electrode
77 bus bar electrode
81 wiring member (interconnector)
90 power supply
99 light source
100 multi-junction photoelectric conversion device
101 to 104 stacked unit

What is claimed is:

1. A method for manufacturing a multi-junction photoelectric conversion device, the method comprising:
    forming a first electrode on a first photoelectric conversion unit comprising a first semiconductor layer as a photoelectric conversion layer, the first electrode comprising a plurality of patterned regions separated from one another by separation grooves; and
    eliminating a leakage existing in the first semiconductor layer by applying a reverse bias voltage between one of the patterned regions of the first electrode and a second photoelectric conversion unit comprising a second semiconductor layer as a photoelectric conversion layer,
    wherein the application of the reverse bias voltage is performed while irradiating the second photoelectric conversion unit with light, generating a photocurrent in the second photoelectric conversion unit that is larger than a photocurrent in the first photoelectric conversion unit,
    wherein the photoelectric conversion device comprises, in the following order:
        the first electrode;
        the first photoelectric conversion unit; and
        the second photoelectric conversion unit,
    wherein the first semiconductor layer is a thin film, and
    wherein the second photoelectric conversion unit is connected to the first photoelectric conversion unit in series.

2. The method according to claim 1, wherein the first semiconductor layer has a band gap that is wider than a band gap of the second semiconductor layer, and the photoelectric conversion device has a light-receiving surface on the first electrode side.

3. The method according to claim 1, wherein the first electrode is a transparent electrode.

4. The method according to claim 1, wherein the second semiconductor layer is a crystalline semiconductor substrate.

5. The method according to claim 1, wherein the first semiconductor layer contains a photosensitive material having a perovskite-type crystal structure.

6. The method according to claim 1, wherein the first electrode is formed by depositing an electrode layer on the first photoelectric conversion unit, followed by forming the separation grooves by irradiating the electrode layer with laser light.

7. The method according to claim 1, wherein the first electrode is formed by depositing an electrode layer on the first photoelectric conversion unit, followed by forming the separation grooves by pattern etching the electrode layer.

8. The method according to claim 1, wherein the first electrode is formed by depositing an electrode layer while the first photoelectric conversion unit is covered with a mask, forming the separation grooves in a region covered with the mask.

9. The method according to claim 1, wherein a metal electrode is disposed in each of the patterned regions of the first electrode, and the metal electrode is electrically connected to a power supply to apply the reverse bias voltage.

10. The method according to claim 1, further comprising electrically connecting the plurality of the patterned regions of the first electrode after eliminating the leakage.

11. The method according to claim 10, wherein the separation groove is filled with an electroconductive material to electrically connect the plurality of the patterned regions of the first electrode.

12. The method according to claim 11, further comprising, after the separation groove is filled with the electroconductive material, eliminating a leakage in the first semiconductor layer remaining in a separation groove-formed region by applying a reverse bias voltage between the electroconductive material filled into the separation groove and the second photoelectric conversion unit while irradiating the second photoelectric conversion unit with light, generating a photocurrent in the second photoelectric conversion unit that is larger than a photocurrent in the first photoelectric conversion unit.

13. The method according to claim 11, further comprising, after the separation groove is filled with the electroconductive material, disposing the electroconductive material on the first electrode over the plurality of the patterned regions of the first electrode.

14. The method according to claim 10, wherein the plurality of the patterned regions of the first electrode are electrically connected by disposing the electroconductive material on the first electrode over the plurality of the patterned regions of the first electrode.

15. The method according to claim 14, wherein the separation groove is filled with an insulating material before the electroconductive material is disposed.

* * * * *